United States Patent [19]
Yamada et al.

[11] Patent Number: 5,989,974
[45] Date of Patent: Nov. 23, 1999

[54] METHOD OF MANUFACTURING A SEMICONDUCTOR DEVICE

[75] Inventors: Keizo Yamada; Toshihide Kuriyama, both of Tokyo, Japan

[73] Assignee: NEC Corporation, Tokyo, Japan

[21] Appl. No.: 09/086,601

[22] Filed: May 29, 1998

[30]     Foreign Application Priority Data

May 30, 1997   [JP]   Japan .................................. 9-141695

[51] Int. Cl.⁶ ................................................. H01L 21/30
[52] U.S. Cl. ........................... 438/407; 438/455; 438/459
[58] Field of Search ................................... 438/404, 407, 438/412, 455, 459

[56]               References Cited

U.S. PATENT DOCUMENTS

| | | | |
|---|---|---|---|
| 4,510,671 | 4/1985 | Kurtz et al. | 29/571 |
| 5,827,755 | 10/1998 | Yonehara et al. | 438/30 |
| 5,854,123 | 12/1998 | Sato et al. | 438/507 |

FOREIGN PATENT DOCUMENTS

| | | |
|---|---|---|
| 60-121715 | 6/1985 | Japan . |
| 5-218421 | 8/1993 | Japan . |
| 5-291543 | 11/1993 | Japan . |

OTHER PUBLICATIONS

Ben Kloeck et al., "Study of Electrochemical Etch–Stop for High–Precision Thickness Control of Silicon Membranes", IEEE Transactions on Electron Devices, vol. 36, No. 4, Apr. 1989, pp. 4–10.

*Primary Examiner*—John F. Niebling
*Assistant Examiner*—Christopher Lattin
*Attorney, Agent, or Firm*—Young & Thompson

[57]                ABSTRACT

A method of manufacturing a semiconductor device having a region which is partially thinner than the rest thereof is disclosed. A semiconductor thin layer is formed on an insulating layer by an annealing treatment after implanting ions into the semiconductor substrate at a predetermined depth. A semiconductor material is formed by epitaxial growing to a predetermined thickness on the semiconductor thin layer. The the insulating layer or eliminating the insulating layer and a part of the semiconductor substrate under the insulating layer is eliminated by an etching operation.

9 Claims, 10 Drawing Sheets

PLAN VIEW

FIG. 8
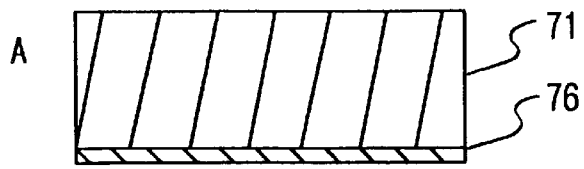
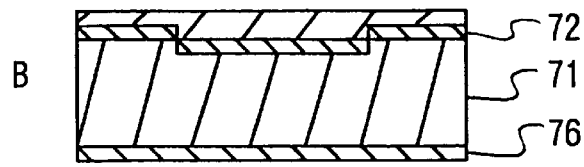
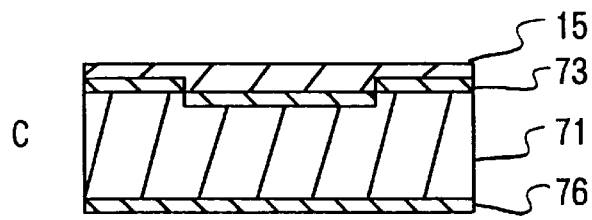
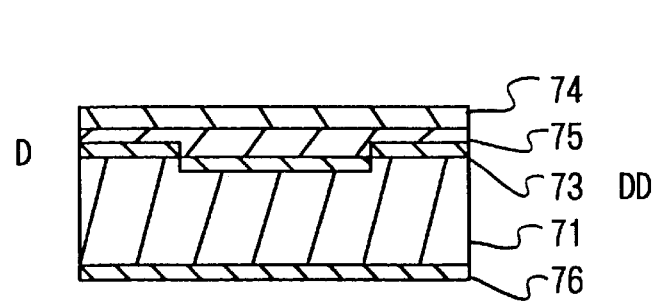 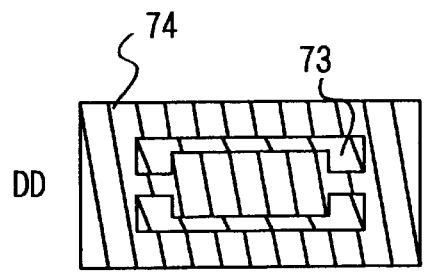
PLAN VIEW
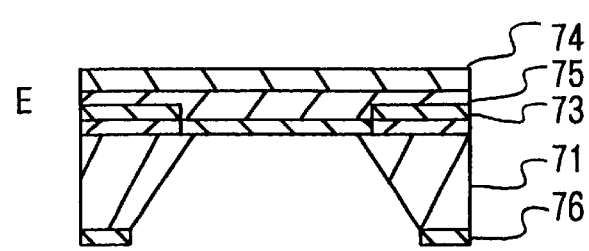

FIG. 9
PRIOR ART
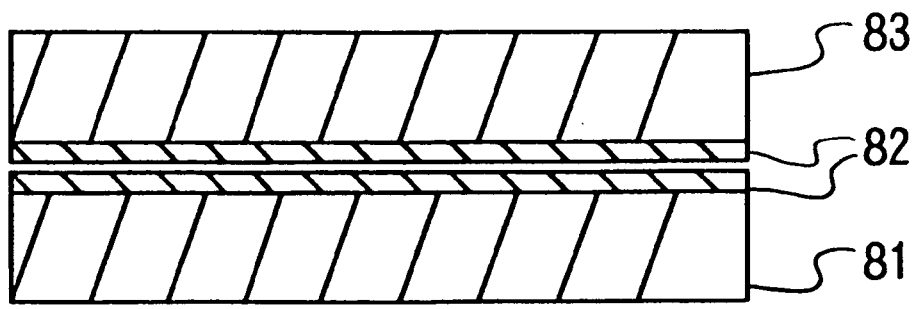
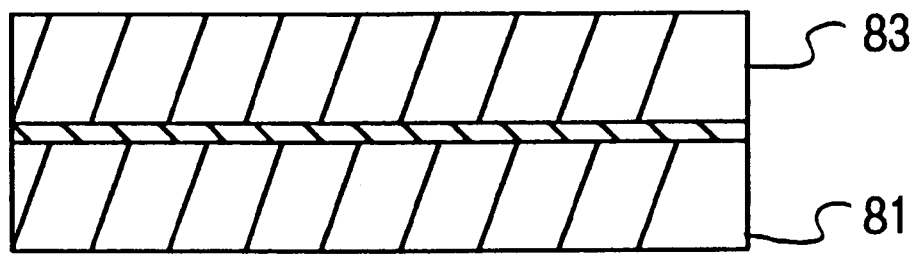
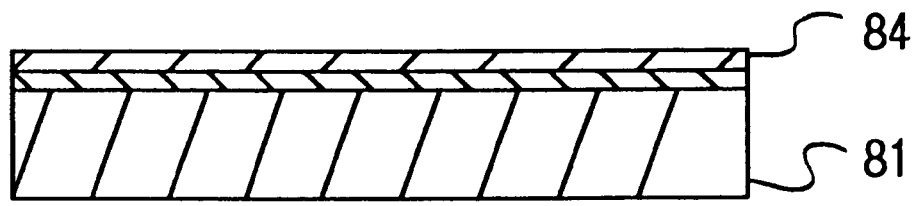

METHOD OF MANUFACTURING A SEMICONDUCTOR DEVICE

BACKGROUND OF THE INVENTION

The present invention relates to a method of manufacturing a semiconductor device, especially to a method of manufacturing a semiconductor device that has a deformable thin-layered structure of mono-crystal silicon to be used in a micro-machining or the like.

FIG. 9 illustrates the steps of the conventional method of forming a silicon thin film (Japanese Patent Laid-Open No. 60-121715 (1985)). As a first step, a first silicon substrate 81 provided as a supporting substrate and a second silicon substrate 83 to be thinned are respectively oxidized to form oxide films 82 on the respective bonding surfaces (FIG. 9A).

Then, two substrates are bonded together by performing a hydrophilic treatment on their bonding surfaces. Under such a condition, they are placed into a furnace to entirely bind them together by the heating (FIG. 9B). Subsequently, the second silicon substrate 83 is ground to a predetermined thickness by a grinding machine. Thus, an SOI (Silicon On Insulator) substrate as shown in FIG. 9C is obtained.

On the other surface opposite to a ground surface 84 of this substrate, furthermore, an oxide film is applied as an etching mask. Then, it is etched by hydrazine or other etching solution until a surface of the oxide film 82 is exposed. At the time of exposing the oxide film, the etching is automatically terminated and a silicon thin film is formed.

FIG. 10 illustrates another method of forming a silicon thin film (IEEE ED Vol. 36 (4), p. 663 (1989)). This method is named as an anodic oxidation that utilizes an anodized film as an etching stop. This method is features in the use of a wafer having PN-junction.

A starting substrate to be used comprises a supporting substrate 91 on which an epitaxial layer 92 is grown. The supporting substrate 91 is provided as a silicon substrate having a P-type conductivity, while the epitaxial layer 92 has a N-type conductivity. From the substrate's surface where the P-type silicon is exposed, an etching operation is carried out in an etching solution 93 such as hydrazine through the oxide film 95 as a pattern mask in the presence of positive voltages on the epitaxial layer. While the etching action proceeds and reaches a region of the N-type epitaxial layer, a current flows from the N-type epitaxial layer to the etching solution. As a result, the an oxide film is formed on the silicon's surface. This oxide film prevents the progress of etching, so that the etching is automatically terminated at that position. Consequently, a silicon thin film specified by a thickness of the N-type epitaxial layer 92 is obtained. In the drawing, numerals 90, 94 and 96 are a power supply, an opposite electrode and oxide films, respectively.

However, a grinding technique is used in the method of forming a silicon thin film using the binding process as described above. Therefore, it is difficult to obtain silicon thin films in large quantity with high accuracy without a thickness variation so as to have a thickness of about one micrometer to several tens of micrometers to be required for a micro-machining. In this case, furthermore, the manufactured substrate is very expensive because the necessary amount of silicon corresponds to two wafers and also throughput of the grinding technique is considerably small.

On the other hand, the method of forming a silicon thin film using an anodic oxidation provides a uniform thickness of the manufactured silicon thin film. In this case, however, there is a problem of increasing its manufacturing cost due to the following facts. That is, a specific configuration is required for applying a voltage on a wafer in comparison with the other semiconductor-manufacturing devices. Also, complicated manufacturing steps are required for forming an electrode on the wafer and for difficulties in a realization of the full automatic production.

SUMMARY OF THE INVENTION

Accordingly, an object of the present invention is to provide a method of manufacturing a semiconductor device having a thickness of one micrometer to several tens of micrometers to be easily, uniformly, and accurately formed at a low cost.

According to the present invention, there is provided a method of manufacturing a semiconductor device having a region which is partially thinner than the rest thereof, comprising steps of:

forming a semiconductor thin layer on an insulating layer by an annealing treatment after implanting ions into the semiconductor substrate at a predetermined depth, epitaxially growing a semiconductor material to a predetermined thickness on the semiconductor thin layer, and eliminating the insulating layer or eliminating the insulating layer and a part of the semiconductor substrate under the insulating layer by an etching operation.

According to the present invention, there is also provided a method of manufacturing a semiconductor device made of a mono-crystal silicon having a region which is partially thinner than the rest thereof comprising steps of:

forming a mono-crystal silicon thin layer on an insulating layer by an annealing treatment after implanting oxygen or nitrogen ions into the semiconductor substrate at a predetermined depth, epitaxially growing a mono-crystal silicon to a predetermined thickness on the mono-crystal silicon thin layer, and eliminating the insulating layer or eliminating the insulating layer and a part of the semiconductor substrate under the insulating layer by an etching operation.

A region where the mono-crystal silicon is epitaxially grown on the mono-crystal silicon thin layer on the insulating layer is a part of the mono-crystal silicon thin layer.

The method further comprises a step of:

epitaxially growing a part of the mono-crystal silicon after epitaxially growing the mono-crystal silicon on the mono-crystal silicon thin layer on the insulating layer.

The method still further comprises a step of:

forming an opening on the mono-crystal silicon thin layer on the insulating layer, introducing an etching solution through the opening, and eliminating a part of the insulating layer or the insulating layer and the silicon substrate which are positioned under the mono-crystal silicon thin layer.

The method further comprises a step of:

performing an ion-implantation of oxygen or nitrogen after partially forming a groove or a hollow in the mono-crystal silicon substrate.

The method still further comprises a step of:

dividing the mono-crystal silicon substrate into a plurality of regions, and forming insulating layers having different depths which are varied from one region to another by variations in acceleration voltage of the ion-implantation to respective regions.

According to a first aspect of the present invention, there is provided a method of manufacturing a semiconductor device having a region which is partially thinner than the rest thereof comprising steps of:

forming a substrate which has a sandwich structure consisting of a first silicon layer as a supporting substrate, a buried oxide layer entirely formed on the first silicon layer, and a second silicon layer formed on the buried oxide layer;

forming an epitaxial layer, by epitaxially growing silicon that contains predetermined impurities, entirely on top of the second silicon layer;

forming an oxide layer on the epitaxial layer and the first silicon layer;

etching the oxide layer on the first silicon layer into a predetermined shape to provide it as a mask for etching the first silicon layer;

shaping the first silicon layer through the use of the mask, by an etching operation until the etching reaches the buried oxide layer;

forming an etching hole by anisotropic-etching the underside of the first silicon layer provided as the supporting substrate; and eliminating unnecessary buried oxide layer and masking oxide layer by etching to obtain a freely supported structure of silicon thin layers.

According to a second aspect of the present invention, there is provided a method of manufacturing a semiconductor device having a region which is partially thinner than the rest thereof comprising steps of:

forming a substrate which has a sandwich structure consisting of a first silicon layer as a supporting substrate, a buried oxide layer formed on a part of the first silicon layer, and a second silicon layer formed on the buried oxide layer and the first silicon layer;

forming an epitaxial layer, by epitaxially growing silicon that contains predetermined impurities, entirely on the second silicon layer;

forming an oxide layer on the epitaxial layer and the first silicon layer;

etching the oxide layer on the first silicon layer into a predetermined shape to provide it as a mask for etching the first silicon layer;

shaping the first silicon layer through the use of the mask, by an etching operation until the etching reaches the buried oxide layer;

forming an etching hole by anisotropic-etching the underside of the first silicon layer provided as the supporting substrate; and eliminating unnecessary buried oxide layer and masking oxide layer by etching to obtain a freely supported structure of silicon thin layers.

According to a third aspect of the present invention, there is provided a method of manufacturing a semiconductor device having a region which is partially thinner than the rest thereof comprising steps of:

forming a substrate which has a sandwich structure consisting of a first silicon layer as a supporting substrate, a buried oxide layer formed on a part of the first silicon layer, and a second silicon layer formed on the buried oxide layer and the first silicon layer;

forming an epitaxial layer, by epitaxially growing silicon that contains predetermined impurities, on a part of the second silicon layer;

forming an oxide layer on the epitaxial layer, second silicon layer and the first silicon layer;

etching the oxide layer on the first silicon layer into a predetermined shape to provide it as a mask for etching the first silicon layer;

shaping the first silicon layer through the use of the mask, by an etching operation until the etching reaches the buried oxide layer;

forming an etching hole by anisotropic-etching the underside of the first silicon layer provided as the supporting substrate; and eliminating unnecessary buried oxide layer and masking oxide layer by etching to obtain a freely supported structure of silicon thin layers.

According to a fourth aspect of the present invention, there is provided a method of manufacturing a semiconductor device having a region which is partially thinner than the rest thereof comprising steps of:

forming a substrate which has a sandwich structure consisting of a first silicon layer as a supporting substrate, a buried oxide layer formed on a part of the first silicon layer, and a second silicon layer formed on the buried oxide layer and the first silicon layer;

forming a first epitaxial silicon layer with a predetermined thickness on the second silicon layer;

forming a first oxide layer on a surface of the first epitaxial silicon layer;

forming a second masking oxide layer on the first epitaxial silicon layer;

removing a part of the second oxide layer;

forming a selective second epitaxial silicon layer by selectively performing an epitaxial growth through the removed portion of the second oxide layer;

forming a third masking oxide layer on the second epitaxial silicon layer;

etching the first oxide layer on the first silicon layer into a predetermined shape;

shaping the first silicon layer through the use of the mask, by an etching operation until the etching reaches the buried oxide layer;

forming an etching hole by anisotropic-etching the underside of the first silicon layer provided as the supporting substrate; and eliminating unnecessary buried oxide layer and masking oxide layer by etching to obtain a freely supported structure of silicon thin layers.

According to a fifth aspect of the present invention, there is provided a method of manufacturing a semiconductor device having a region which is partially thinner than the rest thereof comprising steps of:

forming a substrate which has a sandwich structure consisting of a first silicon layer as a supporting substrate, a buried oxide layer entirely formed on the first silicon layer, and a second silicon layer formed on the buried oxide layer;

forming an epitaxial layer, by epitaxially growing silicon that contains predetermined impurities, entirely on top of the second silicon layer;

forming an oxide layer on the epitaxial layer;

etching the oxide layer on the epitaxial silicon layer into a predetermined shape;

etching the epitaxial and second silicon layers, using the oxide layer, until the etching reaches the buried oxide layer;

etching a part of the buried oxide layer to form an etching groove to be used for performing an anisotropic-etching from the top;

forming an etching hole by performing an anisotropic-etching from the top of the substrate; and eliminating unnecessary masking oxide layer and buried oxide layer to obtain a freely supported silicon thin layer.

According to a sixth aspect of the present invention, there is provided a method of manufacturing a semiconductor device having a region which is partially thinner than the rest thereof comprising steps of:

forming a substrate which has a sandwich structure consisting of a first silicon layer as a supporting substrate, a buried oxide layer entirely formed on the first silicon layer, and a second silicon layer formed on the buried oxide layer;

forming an epitaxial layer, by epitaxially growing silicon that contains predetermined impurities, entirely on top of the second silicon layer;

forming an oxide layer on the epitaxial layer;

etching the oxide layer into a predetermined shape;

etching the epitaxial and second silicon layers, using the oxide layer, until the etching reaches the buried oxide layer;

etching a part of the buried oxide layer to form an etching groove to be used for performing an anisotropic-etching from the top; and eliminating unnecessary oxide layer to obtain a freely supported silicon thin layer.

According to a seventh aspect of the present invention, there is provided a method of manufacturing a semiconductor device having a region which is partially thinner than the rest thereof comprising steps of:

forming a silicon substrate having a portion on the top of which a groove or a hole is formed;

forming a masking oxide layer on the underside of the silicon substrate;

performing an ion-implantation of oxygen or nitrogen from the top of the substrate;

annealing the silicon substrate to form a SIMOX substrate comprising a first silicon substrate, a buried oxide layer, and a second silicon layer with a groove;

forming an epitaxial silicon layer with a predetermined thickness on the second silicon layer;

forming a masking oxide layer on the epitaxial silicon layer;

etching the epitaxial and second silicon layers until the etching operation reaches the buried oxide layer;

partially eliminating the silicon substrate by performing an anisotropic etching from the underside of the silicon substrate; and eliminating unnecessary oxide layers to obtain a freely supported structure of a silicon thin layer.

According to an eighth aspect of the present invention, there is provided a method of manufacturing a semiconductor device having a region which is partially thinner than the rest thereof comprising steps of:

forming a masking oxide layer on the underside of a silicon substrate;

implanting foreign ions of oxygen ions or nitrogen ions into a predetermined region of the substrate's surface with variations in acceleration voltage to form an oxygen-ion induced region or a nitrogen-ion induced region below the surface;

heating the substrate to form a buried oxide layer or a buried nitride layer by reacting implanted ions with silicon atoms that constitute the substrate;

separately forming an epitaxial silicon layer to a predetermined thickness on the silicon thin layer separated by the buried oxide layer;

etching the masking oxide layer to form patterns;

etching the silicon substrate through the masking oxide layer until the etching reaches to the buried oxide layer; and eliminating unnecessary oxide layers to obtain a freely supported structure of a silicon thin layer.

Still according the present invention, there is provided a method of manufacturing a semiconductor device having a region which is partially thinner than the rest thereof comprising steps of:

forming a substrate using a compound semiconductor selected among GaAs, GaN, and GaP;

forming a non-etched layer into the substrate by an ion-implantation;

epitaxially growing the compound semiconductor on a thin layer to make a predetermined thick layer after the ion-implantation; and partially eliminating the supporting substrate by an etching operation.

In the foregoing aspects, the region which is partially thinner than the rest thereof is deformable under the influence of an external force.

Other objects and features will be clarified from the following description with reference to attached drawings.

BRIEF DESCRIPTION OF THE DRAWINGS

FIG. 8 illustrates a manufacturing process of an eighth embodiment according to the present invention;

FIG. 9 illustrates the steps of the conventional method of forming a silicon thin film.

PREFERRED EMBODIMENTS OF THE INVENTION

Preferred embodiments of the present invention will now be described will now be described with reference to the drawings.

Figure 1:
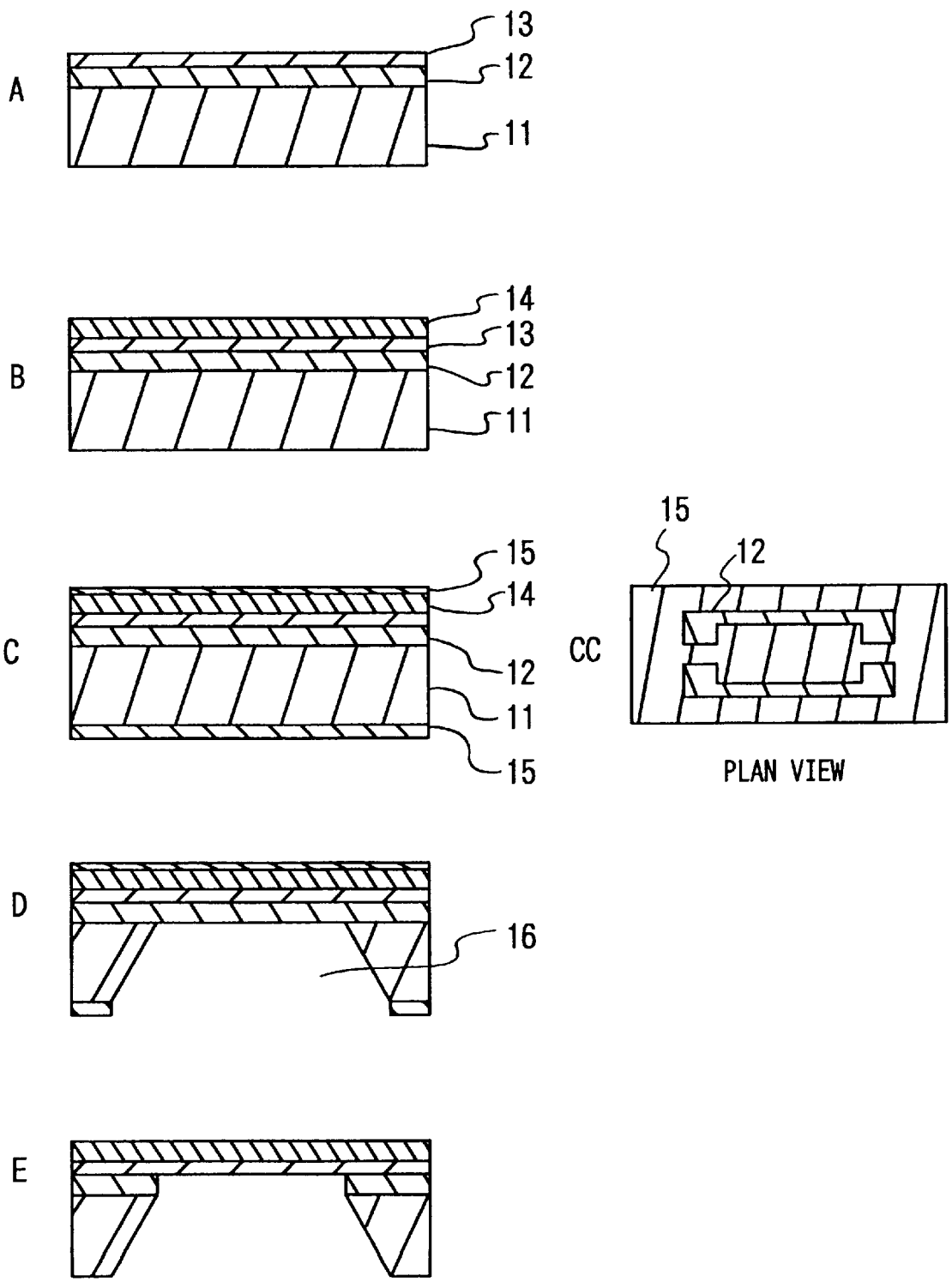
FIG. 1 illustrates a manufacturing process of a first embodiment according to the present invention.

FIG. 1 illustrates a manufacturing process as one of embodiments of the present invention. Initially, a substrate of SIMOX (Separation by Implanted Oxygen) is prepared.

This substrate has a sandwich structure consisting of a first silicon layer 11 as a supporting substrate, a buried oxide film 12 entirely formed on the substrate, and a second silicon layer 13 (FIG. 1A). By epitaxially growing silicon that contains predetermined impurities, an epitaxial layer 14 is entirely formed on the top of the substrate (FIG. 1B). For patterning the silicon thin film into a predetermined shape, an oxide film 15 to be provided as a mask is formed. The oxide film 15 on the top is etched into a predetermined shape to provide it as a mask for etching the under-layered silicon thin film.

Through the use of this mask, the silicon thin film is shaped by an etching operation using a reactive-etching or anisotropic-etching solution until the etching reaches the buried oxide film 12 (FIGS. 1C and 1CC)). Then, the first silicon layer 11 provided as the supporting substrate is subjected into an anisotropic-etching in which the underside of the layer is etched by an alkali etchant such as hydrazine or TMAH to form an etching hole 16. The use of the etchant characterized in that a rate of etching the oxide film is considerably lower than a rate of etching the silicon, such as a hydrazine hydrate solution, a potassium hydrate solution, or TMAH, allows an automatic termination of the anisotropic-etching at the SIO-structured buried oxide film 12 (FIG. 1D). Finally, a freely supported structure of silicon thin layers is obtained through the elimination of unnecessary buried oxide film 12 and masking oxide film 15 by subjecting into an etchant such as a buffered fluorine acid.

Figure 2:
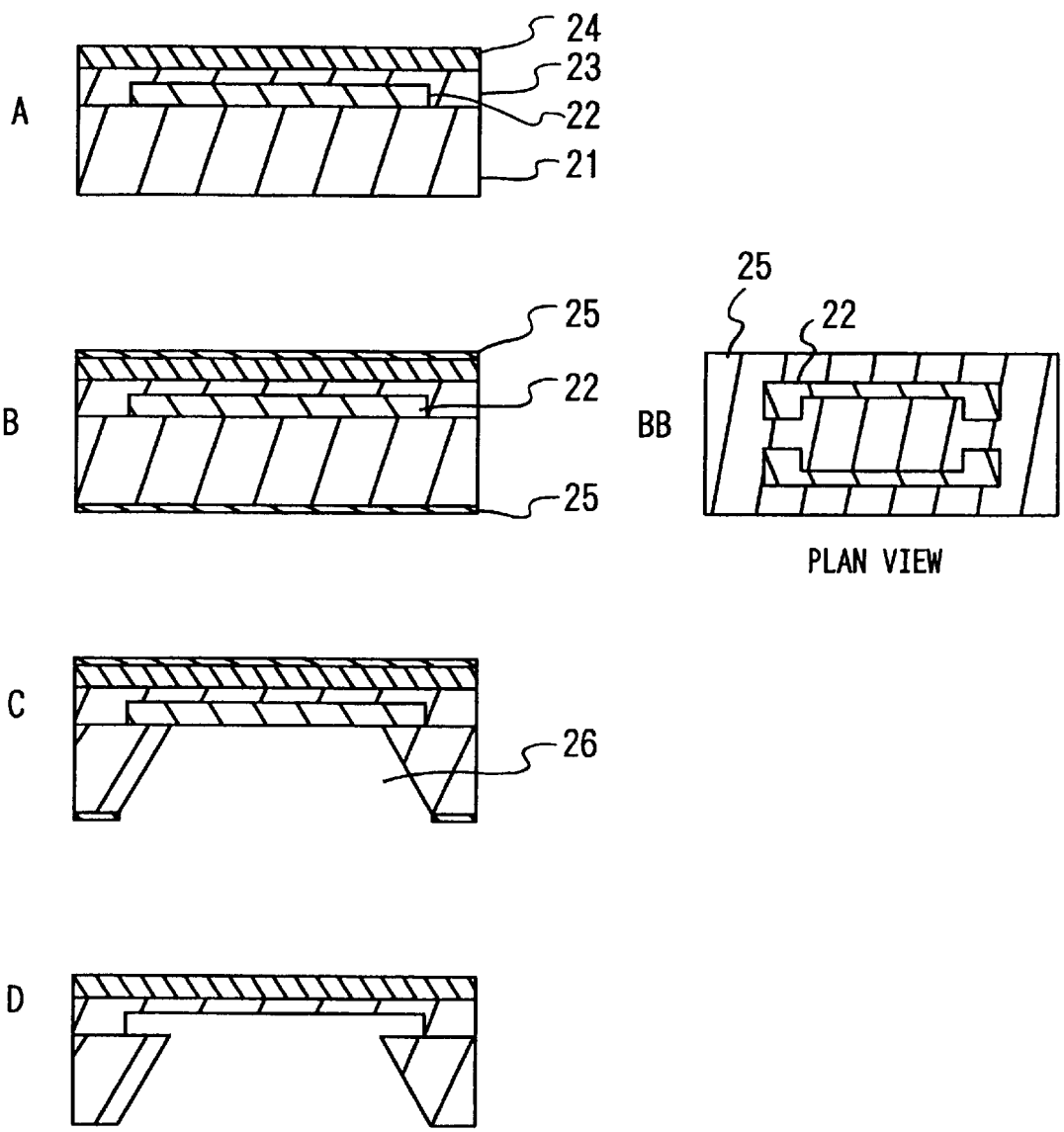
FIG. 2 illustrates a manufacturing process of a second embodiment according to the present invention.

FIG. 2 illustrates a manufacturing process of another embodiment of the present invention. Initially, a substrate of SIMOX (Separation by Implanted Oxygen) is prepared. This substrate has a sandwich structure consisting of a first silicon layer 21 as a supporting substrate, a buried oxide film 22 formed on a part of the substrate, and a second silicon layer 23. By epitaxially growing silicon, an epitaxial layer 24 having a predetermined thickness is formed on the substrate (FIG. 2A).

Next, a masking oxide film 25 is formed on the surface and patterned into a predetermined shape. Then, it is used as a mask to etch the silicon thin layer portion until the etching reaches the buried oxide film 22 (FIGS. 2B and 2BB). Then, the first silicon layer 21 provided as the supporting substrate is etched from its underside to form an etching hole 26 (FIG. 2C). Finally, a freely supported structure of silicon thin layers is obtained through the elimination of unnecessary buried oxide film 22 and masking oxide film 25 by subjecting into an etchant such as a buffered fluorine acid (FIG. 2D).

Figure 3:
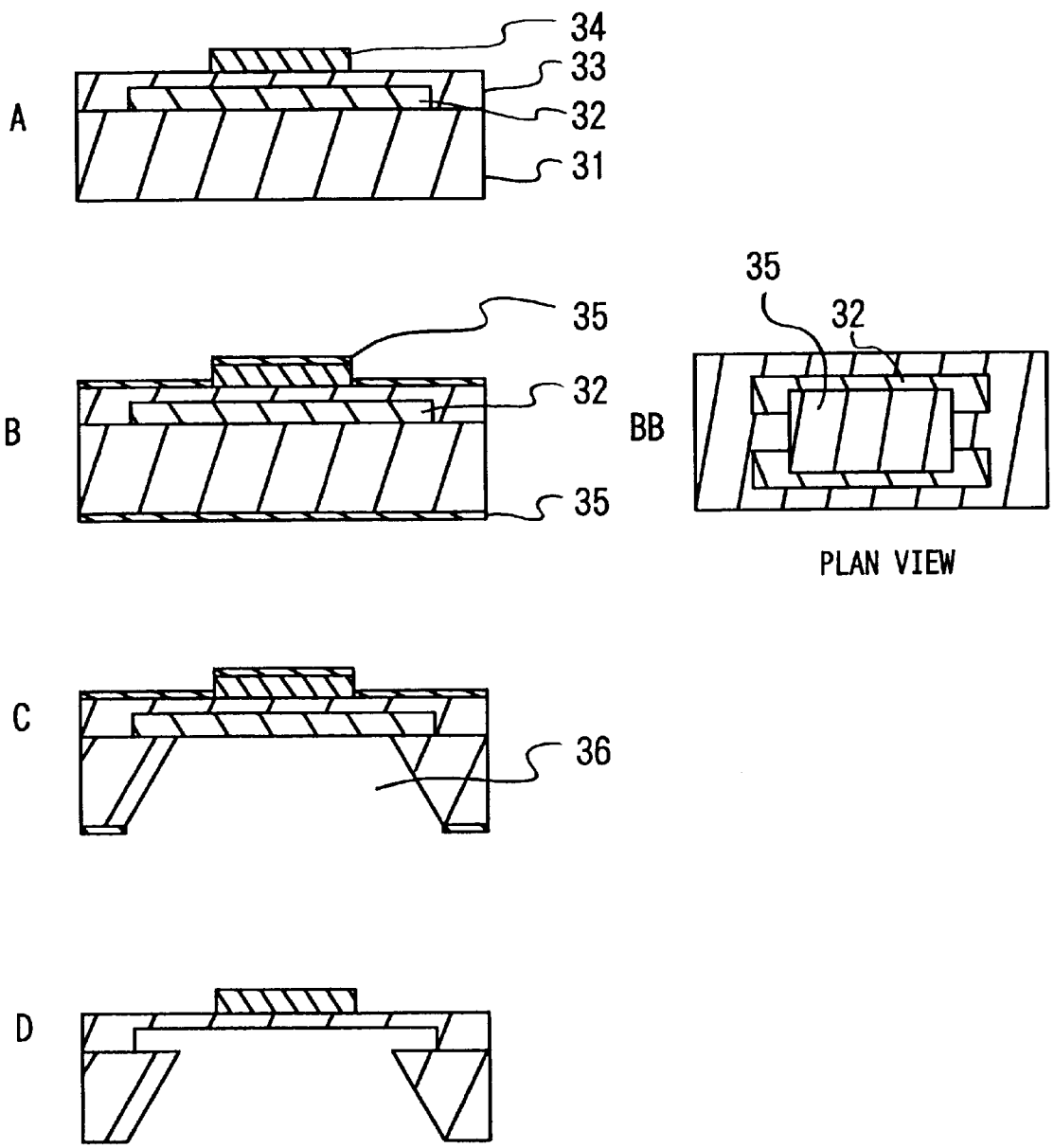
FIG. 3 illustrates a manufacturing process of a third embodiment according to the present invention.

FIG. 3 illustrates a manufacturing process of other embodiment of the present invention. A substrate of SIMOX (Separation by Implanted Oxygen) is prepared. This substrate has a sandwich structure consisting of a first silicon layer 31 as a supporting substrate, a buried oxide film 32 formed on a part of the substrate, and a second silicon layer 33. By epitaxially growing silicon, an epitaxial layer 34 having a predetermined thickness is formed on a part of the substrate (FIG. 3A).

Next, a masking oxide film 35 is formed on the epitaxial silicon layer 34 and the second silicon layer 33. Then, the masking oxide film 35 is formed into a predetermined pattern to be used as a mask for etching the silicon under the mask. Also, a masking oxide film 35 is formed on a surface of the underside of the first silicon layer 31. Through the use of this mask on the surface, the under-layered silicon thin film is etched until the etching reaches to the buried oxide film 32 and at the same time the epitaxial silicon layer 34 is formed into a predetermined shape (FIGS. 3B and 3BB). Then, the first silicon layer 33 provided as the supporting substrate is etched from its underside to form an etching hole 36 (FIG. 3C). Finally, a freely supported structure of silicon thin layers is obtained through the elimination of unnecessary buried oxide film 32 and masking oxide film 35 (FIG. 3D).

Figure 4:
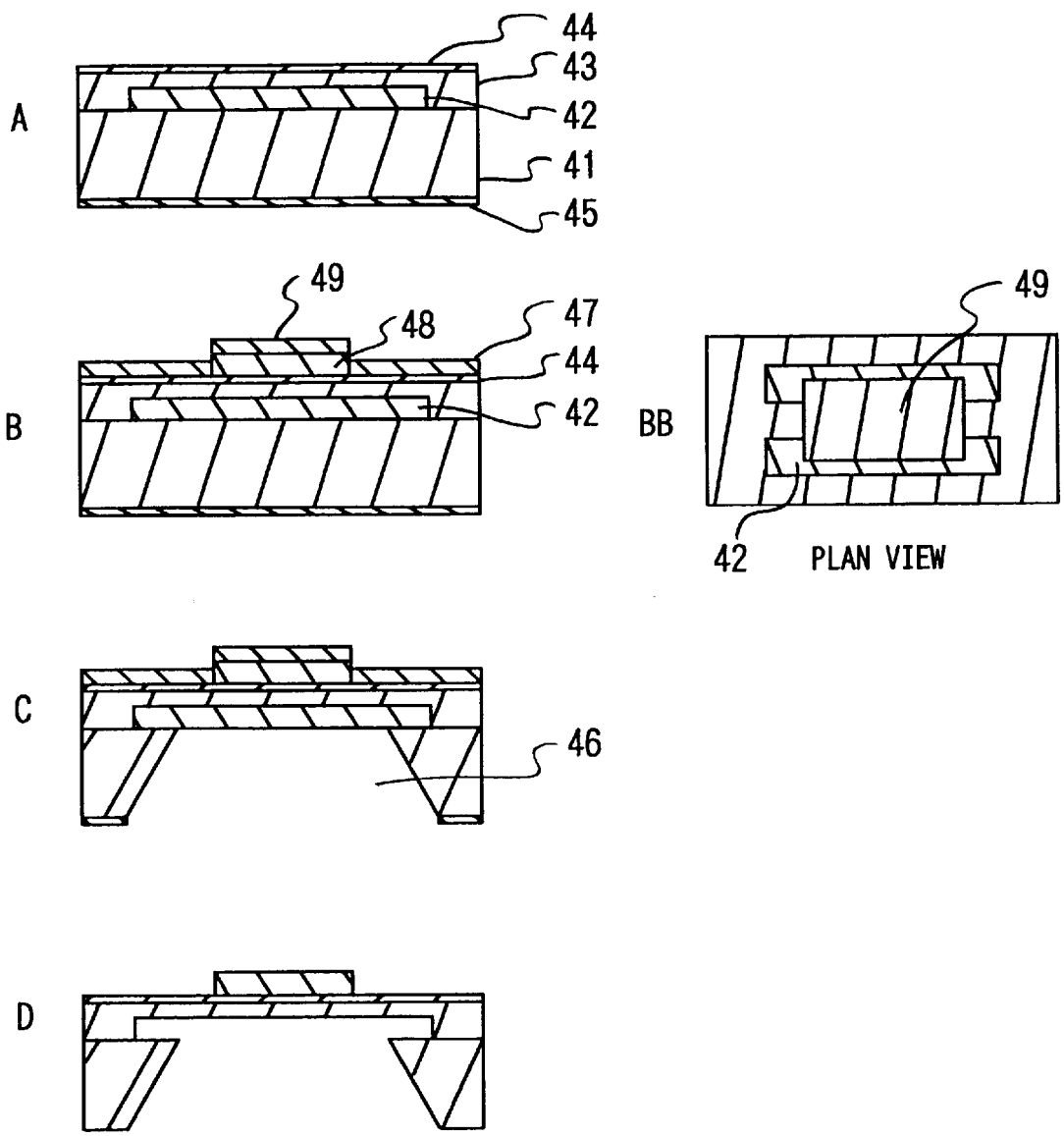
FIG. 4 illustrates a manufacturing process of a fourth embodiment according to the present invention.

FIG. 4 illustrates a manufacturing process of still other embodiment of the present invention. In this embodiment, a structural body having regions with different thickness, which is comparatively thicker than the conventional SIMOX substrate, can be obtained by repeating the process of epitaxial growth two times.

First, a SIMOX substrate comprising a first silicon layer 41 provided as a supporting substrate, a buried oxide film 42, a second silicon layer 43 is prepared. On the SIMOX substrate, an epitaxial silicon layer with a predetermined thickness is formed. On a surface of the first silicon layer 41 positioned at the underside of the substrate, a masking oxide film 45 is formed (FIG. 4A).

Furthermore, a masking oxide film 47 is formed on an epitaxial silicon layer 44. A hole is partially made in the film to form a selective epitaxial silicon layer 48 by selectively performing an epitaxial growth through the hole. Also, a masking oxide film 49 is formed on the layer 48. Subsequently, the masking oxide film 45 is patterned into a predetermined shape and used as a mask for etching the silicon thin layer portion. The etching is performed until it reaches the buried oxide film 42 (FIGS. 4B) and 4BB). Then, the first silicon layer 41 provided as the supporting substrate is etched from its underside to form an etching hole 46 (FIG. 4C). Finally, a freely supported structure of silicon thin layers is obtained through the elimination of unnecessary buried oxide film 42 and masking oxide films 45, 47, 49 (FIG. 4D).

Figure 5:
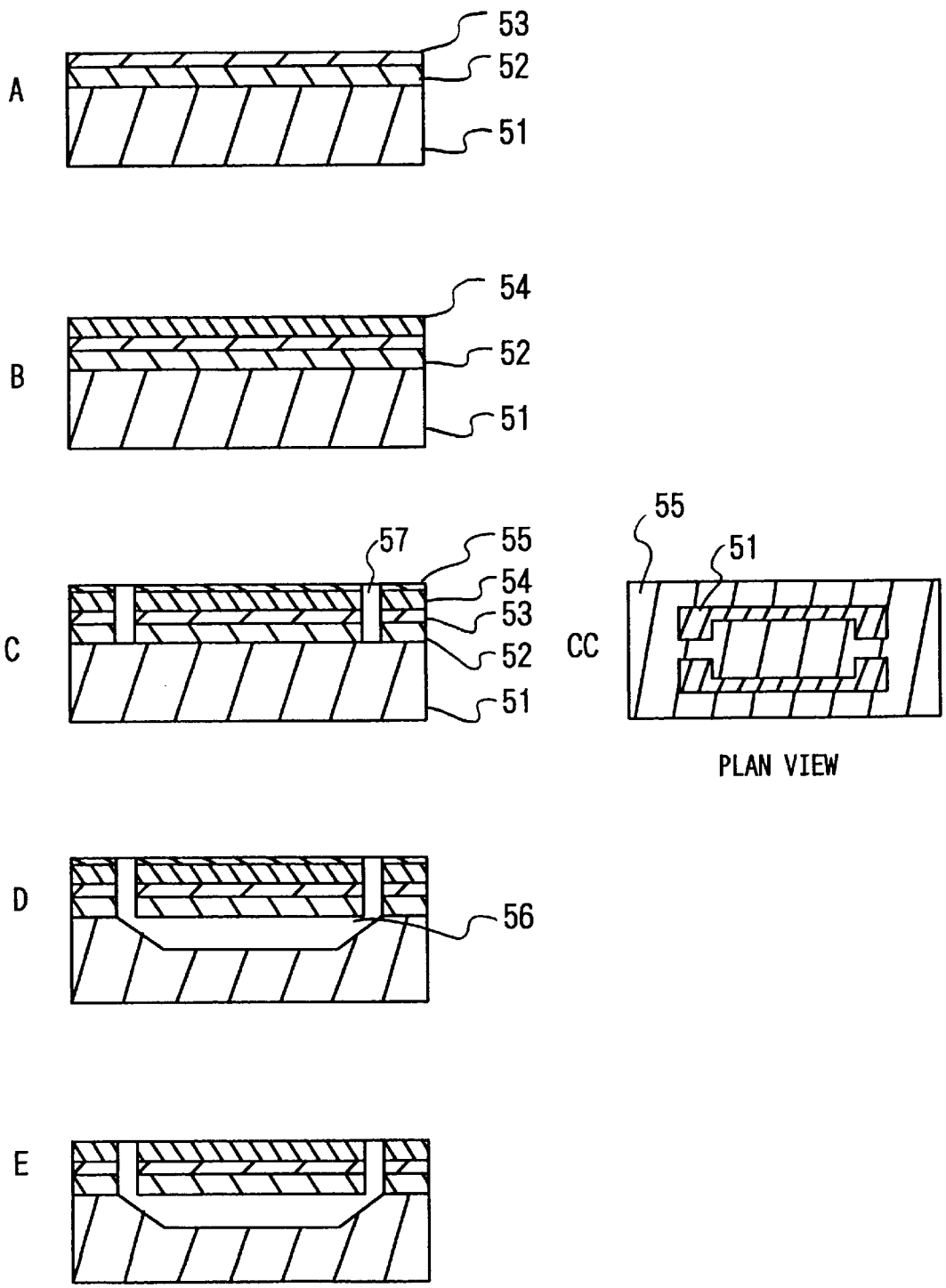
FIG. 5 illustrates a manufacturing process of a fifth embodiment according to the present invention.

FIG. 5 illustrates a manufacturing process of other embodiment of the present invention. A feature of the embodiment, which is different from the embodiments described above, is that a supporting substrate (a first silicon layer) and a buried oxide film (a sacrificial layer) are eliminated from the side of an epitaxial silicon layer.

First, a SIMOX substrate is used as a starting substrate just as in the case of the first embodiment (FIG. 5A). An epitaxial growth is performed on a surface of the substrate to form an epitaxial silicon layer 54 with a predetermined thickness of the silicon thin film (FIG. 5B).

A patterning mask for etching the silicon film is provided by forming a masking oxide film 55 on the layer 54 and etching the film 55 into a predetermined shape. Using this mask, the silicon layers 53, 54 are etched until the etching reaches the buried oxide film 53. A part of the buried oxide film 52 is also etched to form an etching groove 57 to be used for performing an anisotropic-etching from the top (FIGS. 5C, 5CC). Then, an etching hole 56 is formed by performing an anisotropic-etching from the top of the substrate (FIG. 5D). Finally, unnecessary masking oxide film 55 and buried oxide film 52 are eliminated and a freely supported silicon thin film is obtained (FIG. 5E).

Figure 6:
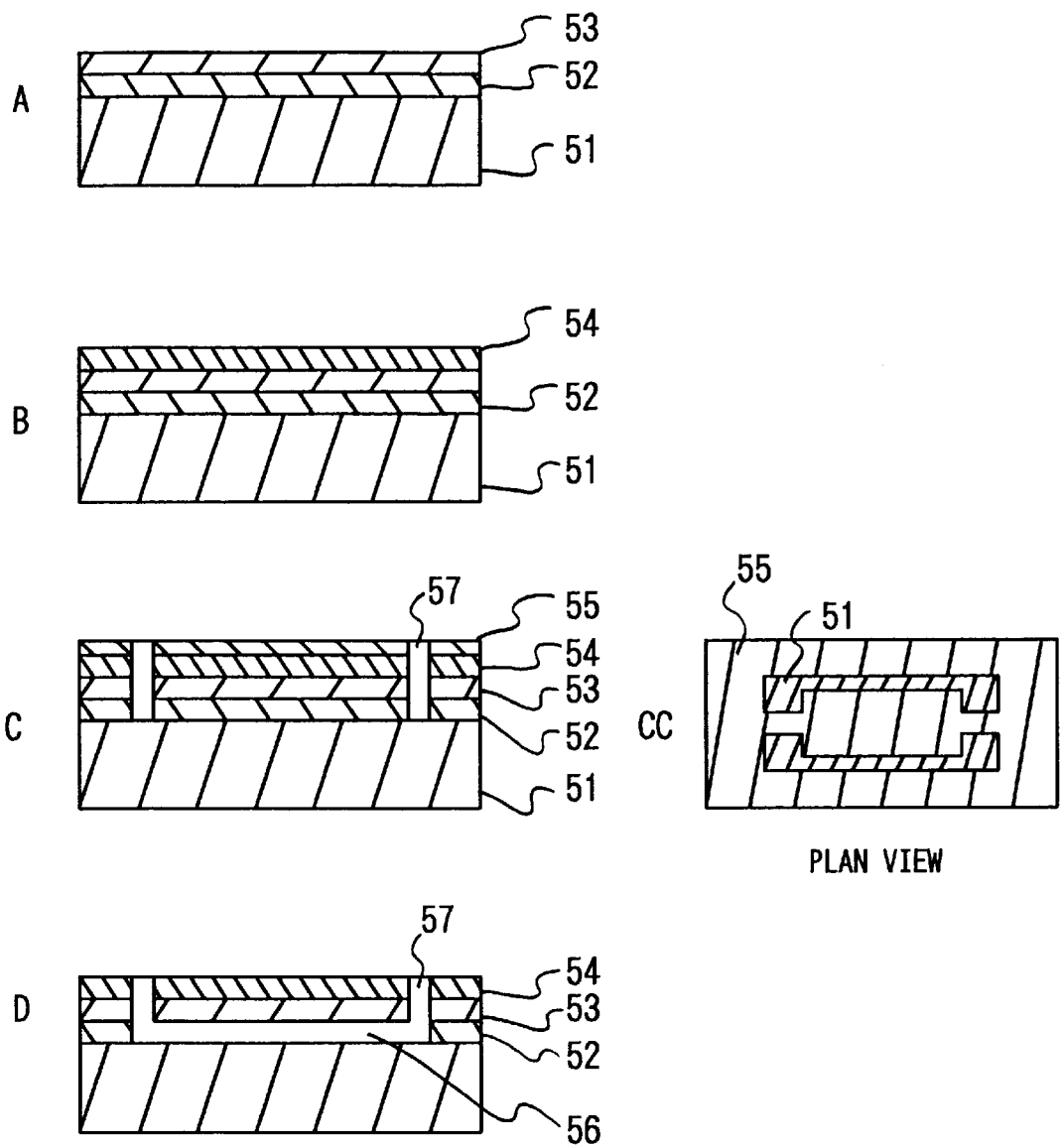
FIG. 6 illustrates a manufacturing process of a sixth embodiment according to the present invention.

FIG. 6 illustrates a manufacturing process of further embodiment of the present invention. A feature of the present embodiment, which is different from the embodiments described above, is that only a buried oxide film (a sacrificial layer) is eliminated from the side of an epitaxial silicon layer.

First, a SIMOX substrate is used as a starting substrate just as in the case of the first embodiment (FIG. 6A). An epitaxial growth is performed on a surface of the substrate to form an epitaxial silicon layer 54 with a predetermined thickness (FIG. 6B).

A patterning mask for etching the silicon film is provided by forming a masking oxide film 55 on the layer 54 and etching the film 55 into a predetermined shape. Using this mask, the silicon layers 53, 54 are etched until the etching reaches the buried oxide film 53. A part of the buried oxide film 52 is also etched to form an etching groove 57 to be used for performing an anisotropic-etching from the top (FIGS. 6C, 6CC). Finally, a hollow is formed in the underside of the silicon thin film by eliminating the buried oxide film 52 as a result of an etching operation, and also unnecessary oxide film 55 is eliminated to obtain a freely supported silicon thin film (FIG. 6D).

Figure 7:
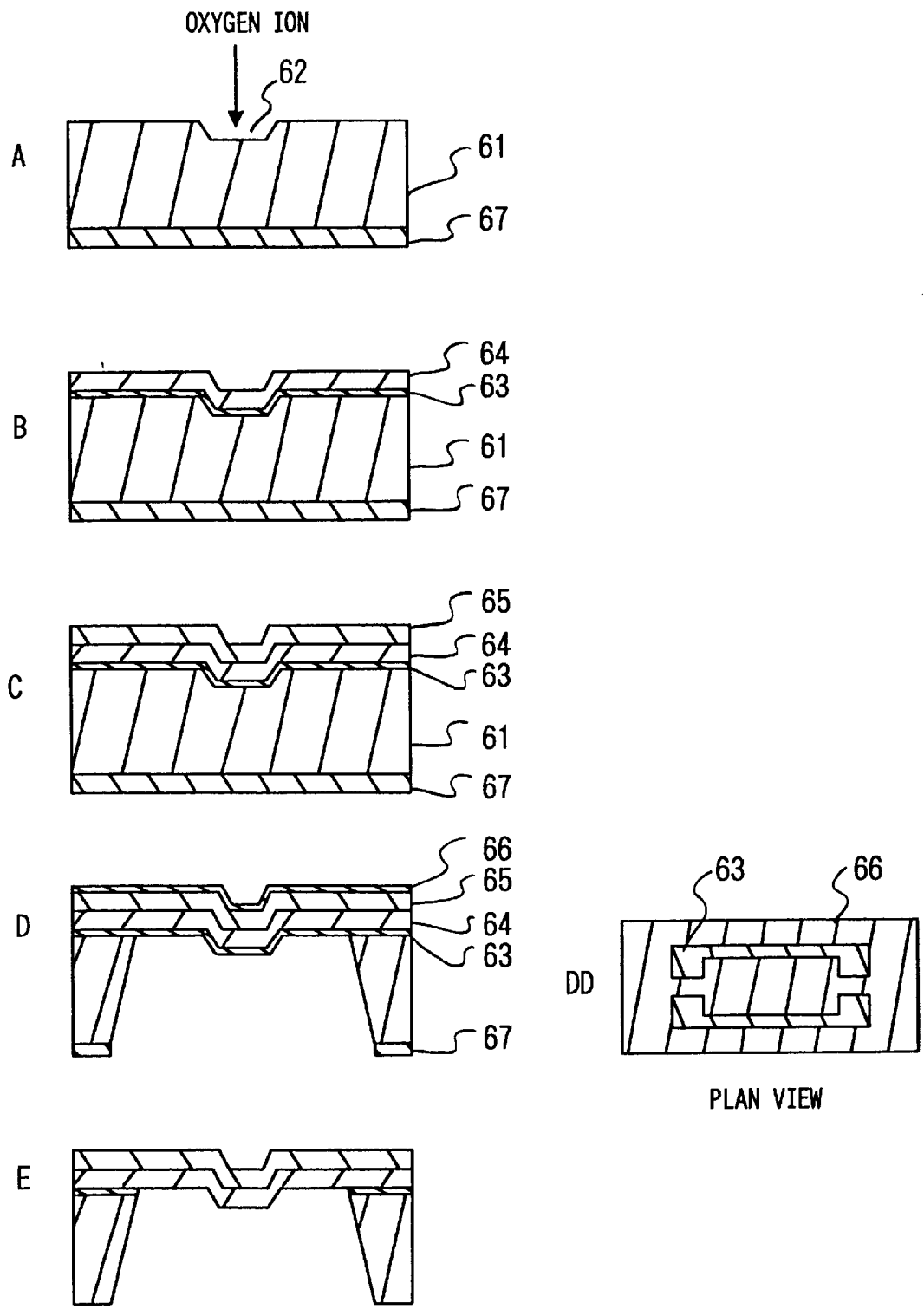
FIG. 7 illustrates a manufacturing process of a seventh embodiment according to the present invention.
Figure 10:
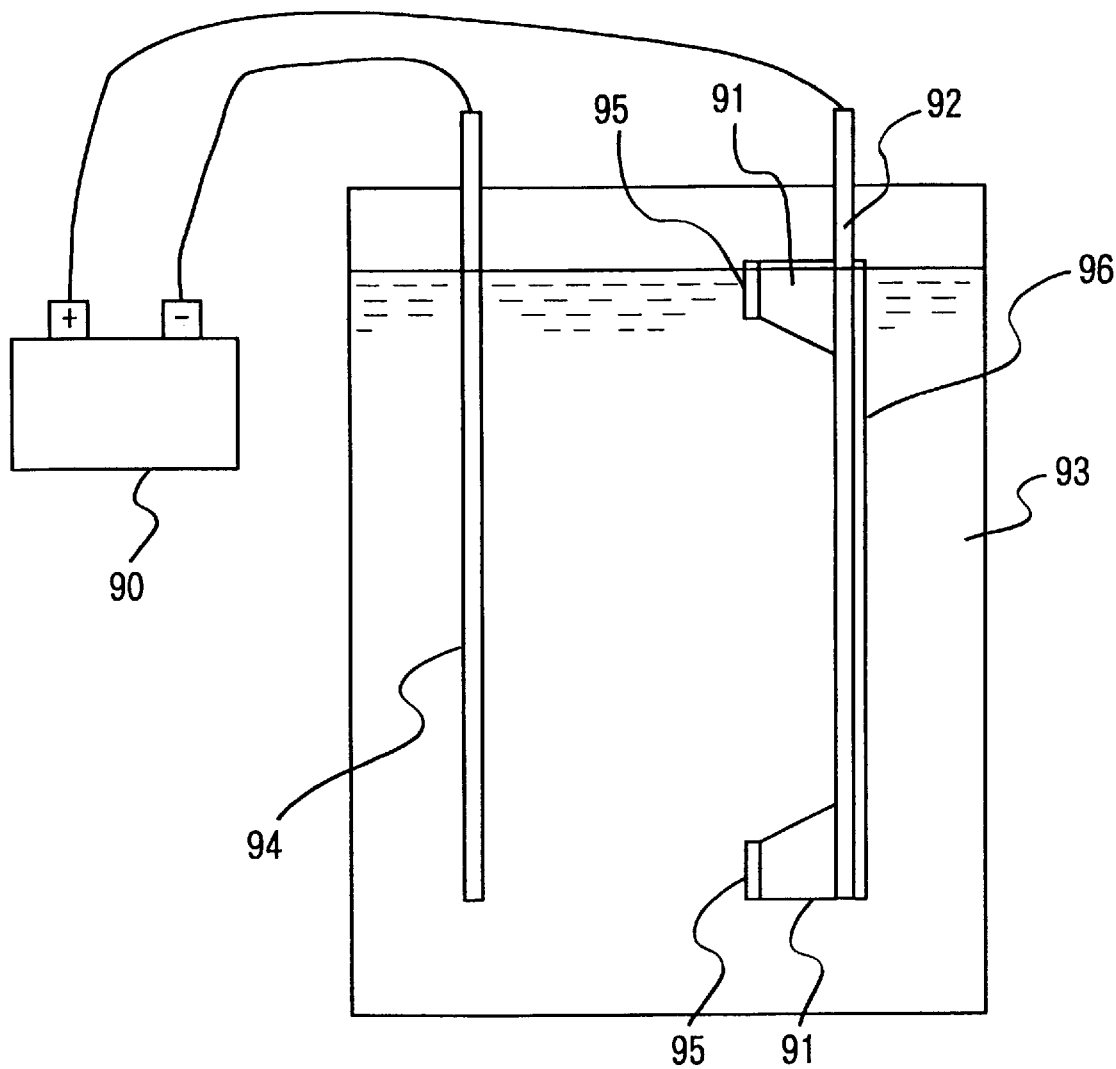
FIG. 10 illustrates another method of forming a silicon thin film.

FIG. 7 illustrates a manufacturing process of other embodiment of the present invention. A feature of the present embodiment, which is different from the embodiments described above, is that a silicon substrate 61 having a portion on which a groove 62 or a hole is formed is used as a starting substrate.

First, the silicon substrate 61 having a masking oxide film 67 on its underside and a groove 62 on its top is prepared. Then, an ion-implantation of oxygen or nitrogen is performed from the top (FIG. 7A).

For the next step, the silicon substrate is subjected to an annealing treatment, resulting in the formation of a SIMOX substrate comprising a silicon substrate 61, a buried oxide film 63, and a silicon layer 64 with a groove (FIG. 7B). Furthermore, an epitaxial silicon layer 65 with a predetermined thickness is formed on the layer 64 (FIG. 7C). Then, a masking oxide film 66 is formed on that layer and provided as a patterning mask. The silicon thin films 64, 65 are etched until the etching operation reaches the buried oxide film 63, resulting in the patterning of a predetermined shape (FIGS. 7D and 7DD)). In addition, the supporting substrate (silicon substrate 61) is partially eliminated by performing an anisotropic etching from the underside of the silicon substrate (FIG. 7D). Finally, a freely supported structure of a silicon thin film is obtained by eliminating unnecessary oxide films 63, 66 (FIG. 7E).

According to the method of this embodiment, therefore, silicon thin films having various curved surfaces such as wave-formed silicon thin films can be obtained.

FIG. 8 illustrates a manufacturing process of further embodiment of the present invention. A feature of the present embodiment is that buried oxide films 73 which are different in their distances from the top.

To begin with, a silicon substrate where a masking oxide film 76 is formed on the underside thereof is used as a starting substrate (FIG. 8A). For the next step, foreign ions such as oxygen ions or nitrogen ions are implanted into a predetermined region of the substrate's surface with variations in acceleration voltage to form an oxygen-ion induced region 72 or a nitrogen-ion induced region below the surface at a relatively shallow depth (FIG. 8B). If the acceleration voltage is large, a permeability of ion through the silicon substrate is increased. Therefore, the ions are introduced from the surface to a deep position.

Then, the substrate is heated sufficiently to form buried oxide film 73 or a buried nitride film by reacting implanted ions with silicon atoms that constitute the substrate (FIG. 8C). On the silicon thin film 75 separately formed by the buried oxide film 73, an epitaxial silicon layer 74 is grown to a predetermined thickness. After the epitaxial growth, a silicon thin film region including the epitaxial silicon layer is etched until the etching reaches to the buried oxide film 73 to form it into a predetermined shape (FIGS. 8D and 8DD)). Finally, the supporting substrate (silicon substrate 71) is partially eliminated from the underside by an anisotropic etching to obtain a freely supported structure of silicon thin film having portions of different thickness (FIG. 8E). Consequently, a freely-supported silicon thin film is obtained by eliminating unnecessary masking oxide film 76 and buried oxide film 73.

In general, the structural body obtained by the above process is used in air. However, it may be also used in a liquid or in a vacuum.

A silicon thin film is obtained by the SIMOX method of annealing at a high temperature including the step of an annealing treatment after an ion-implantation of oxygen or nitrogen at a predetermined depth in the single-crystal silicon thin film, so that the resulting single-crystal silicon thin film is of good quality in spite that it is a considerably thin film with a thickness of one micrometer or less. Using this layer as a seed crystal, therefore, an epitaxial layer can be formed. Through the use of the epitaxial-growth technology, a silicon thin film having a thickness of one micrometer to several tens of micrometers can be easily obtained with accuracy under the growth condition to be used in the general manufacturing process. In addition, it is possible to regulate the composition of impurities in the silicon thin film without restraint if the impurities are implanted during the epitaxial growth.

Under the silicon thin film thus obtained, there is an anisotropic-etching resistant film such as an oxide film or a nitride film. If an anisotropic etching is performed from the underside of the substrate, the etching is automatically terminated at the time of reaching to the oxide film or the like. As a result, a freely-supported thin film made of mono-crystal silicon is obtained. A thickness of the obtained thin film can be easily controlled by the above epitaxial growth.

The silicon thin film has been described above. However, it is also possible to apply the present invention to a substrate using a compound semiconductor such as GaAs, GaN, and GaP to make a freely-supported thin film by the process including the steps of forming a non-etched film into the substrate by an ion-implantation, epitaxially growing the compound semiconductor on a thin film to make a predetermined thick film after the ion-implantation, and partially eliminating the supporting substrate by an etching operation.

According to the present invention, as is evident from the above description, a semiconductor thin film having a thickness of one micrometer to several tens of micrometers can be uniformly and precisely formed with ease at a low cost.

According to the present invention, furthermore, a semiconductor element having a freely-supported single-crystal structure of silicon thin film with partially different thickness, a single-crystal structure with a groove or a hollow, or a complex structure such as a colligate, which is not realized by the conventional method, can be uniformly and precisely formed with ease at a low cost.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A method of manufacturing a semiconductor device having a region which is partially thinner than the rest thereof, comprising steps of:

forming a semiconductor thin layer on an insulating layer by an annealing treatment after implanting ions into the semiconductor substrate at a predetermined depth, epitaxially growing a semiconductor material to a predetermined thickness on the semiconductor thin layer, and eliminating the insulating layer or eliminating the insulating layer and a part of the semiconductor substrate under the insulating layer by an etching operation.

2. A method of manufacturing a semiconductor device made of a mono-crystal silicon having a region which is partially thinner than the rest thereof comprising steps of:

forming a mono-crystal silicon thin layer on an insulating layer by an annealing treatment after implanting oxygen or nitrogen ions into the semiconductor substrate at a predetermined depth, epitaxially growing a mono-crystal silicon to a predetermined thickness on the mono-crystal silicon thin layer, and eliminating the insulating layer or eliminating the insulating layer and a part of the semiconductor substrate under the insulating layer by an etching operation.

3. The method of manufacturing a semiconductor device as claimed in claim 2, wherein a region where the mono-crystal silicon is epitaxially grown on the mono-crystal silicon thin layer on the insulating layer is a part of the mono-crystal silicon thin layer.

4. The method of manufacturing a semiconductor device as claimed in claim 2, further comprising a step of:

epitaxially growing a part of the mono-crystal silicon after epitaxially growing the mono-crystal silicon on the mono-crystal silicon thin layer on the insulating layer.

5. The method of manufacturing a semiconductor device as claimed in claim 2, further comprising steps of:

forming an opening on the mono-crystal silicon thin layer on the insulating layer, introducing an etching solution through the opening, and eliminating a part of the insulating layer or the insulating layer and the silicon substrate which are positioned under the mono-crystal silicon thin layer.

6. The method of manufacturing a s emiconductor device as claimed in claim 2, further comprising a step of:

performing an ion-implantation of oxygen or nitrogen after partially forming a groove or a hollow in the mono-crystal silicon substrate.

7. The method of manufacturing a semiconductor device as claimed in claim 2, further comprising steps of:

dividing the mono-crystal silicon substrate into a plurality of regions, and forming insulating layers having different depths which are varied from one region to another by variations in acceleration voltage of the ion-implantation to respective regions.

8. A method of manufacturing a semiconductor device having a region which is partially thinner than the rest thereof comprising steps of:

forming a substrate which has a sandwich structure consisting of a first silicon layer as a supporting substrate, a buried oxide layer entirely formed on the first silicon layer, and a second silicon layer formed on the buried oxide layer;

forming an epitaxial layer, by epitaxially growing silicon that contains predetermined impurities, entirely on top of the second silicon layer;

forming an oxide layer on the epitaxial layer;

etching the oxide layer into a predetermined shape;

etching the epitaxial and second silicon layers, using the oxide layer, until the etching reaches the buried oxide layer;

etching a part of the buried oxide layer to form an etching groove to be used for performing an anisotropic-etching from the top; and eliminating unnecessary oxide layer to obtain a freely supported silicon thin layer.

9. The method of manufacturing a semiconductor device having a region which is partially thinner than the rest thereof according to claims 1, wherein the region is deformable under the influence of an external force.

* * * * *